(12) United States Patent  (10) Patent No.: US 8,711,561 B2
Matsumoto et al.  (45) Date of Patent: Apr. 29, 2014

(54) COOLING STRUCTURE FOR ELECTRONIC DEVICE

(75) Inventors: Subaru Matsumoto, Osaka (JP); Kou Komori, Nara (JP); Daisuke Katayama, Kyoto (JP); Katsumi Otani, Osaka (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 13/517,190

(22) PCT Filed: Jan. 27, 2012

(86) PCT No.: PCT/JP2012/000514
§ 371 (c)(1),
(2), (4) Date: Jun. 19, 2012

(87) PCT Pub. No.: WO2012/105199
PCT Pub. Date: Aug. 9, 2012

(65) Prior Publication Data
US 2012/0314365 A1  Dec. 13, 2012

(30) Foreign Application Priority Data
Feb. 3, 2011  (JP) .................................. 2011-021832

(51) Int. Cl.
*H05K 7/20* (2006.01)
(52) U.S. Cl.
USPC .......................... 361/690; 361/694; 361/695
(58) Field of Classification Search
USPC ........................................................ 361/690
See application file for complete search history.

(56) References Cited

U.S. PATENT DOCUMENTS

| 5,991,155 A | 11/1999 | Kobayashi et al. | |
|---|---|---|---|
| 6,027,535 A * | 2/2000 | Eberle et al. | 361/690 |
| 6,226,182 B1 * | 5/2001 | Maehara | 361/695 |
| 6,488,126 B1 * | 12/2002 | Yamakawa et al. | 187/391 |
| 7,218,517 B2 * | 5/2007 | Wolford et al. | 361/695 |
| 7,248,471 B2 * | 7/2007 | Wabiszczewicz | 361/694 |
| 7,265,984 B2 | 9/2007 | Numata | |
| 7,312,998 B2 | 12/2007 | Kamemoto et al. | |
| 7,765,514 B2 * | 7/2010 | Baumgartner et al. | 716/103 |
| 8,576,565 B2 * | 11/2013 | Matsumoto et al. | 361/697 |
| 2006/0104025 A1 * | 5/2006 | Wabiszczewicz | 361/694 |
| 2006/0120043 A1 * | 6/2006 | Wolford et al. | 361/695 |
| 2011/0002102 A1 * | 1/2011 | Brok et al. | 361/701 |

FOREIGN PATENT DOCUMENTS

JP  10-173371  6/1998
(Continued)

*Primary Examiner* — Gregory Thompson
(74) *Attorney, Agent, or Firm* — Hamre, Schumann, Mueller & Larson, P.C.

(57) ABSTRACT

A heat generating component (3) is mounted on one surface of a circuit board (2). A heat release member (4) is disposed between the one surface and an opposite wall (12) of a housing (1). The heat release member (4) has a plate (41) that extends in a specified direction and is in contact with the heat generating component (3), and fins (42) that project from the plate (41) toward the opposite wall (12). In a region of the opposite wall (12) of the housing overlapping with the heat release member (4), an air inlet (1c) is provided so as to extend in the specified direction. The heat release member (4) is, at both end portions thereof in the specified direction, in contact with the opposite wall (12) via heat-conductive spacers (9), and a gap (8) is formed between the fins (42) and the opposite wall (12).

8 Claims, 10 Drawing Sheets

(56) References Cited

FOREIGN PATENT DOCUMENTS

| | | |
|---|---|---|
| JP | 10-229287 | 8/1998 |
| JP | 11-355623 | 12/1999 |
| JP | 2003-101266 | 4/2003 |
| JP | 2004-363525 | 12/2004 |
| JP | 2005-085908 | 3/2005 |
| JP | 2005-251916 | 9/2005 |
| JP | 2006-222146 | 8/2006 |
| JP | 2006-237149 | 9/2006 |
| JP | 2010-140194 | 6/2010 |
| WO | 01/81224 | 11/2011 |

* cited by examiner

PRIOR ART

PRIOR ART

COOLING STRUCTURE FOR ELECTRONIC DEVICE

TECHNICAL FIELD

The present invention relates to a cooling structure for an electronic device incorporating a heat generating component.

BACKGROUND ART

Generally, a heat generating component, such as a large scale integration circuit, which is a so-called LSI, and a microprocessor, is mounted on a circuit board included in an electronic device. In recent years, the heat generating component has been reduced in size and increased in operation frequency, and thus it tends to generate a larger amount of heat. Accordingly, there has been a demand for an effective solution for cooling the heat generating component.

For example, Patent Literature 1 discloses a cooling structure for an electronic device as shown in FIG. 9. In the cooling structure shown in FIG. 9, an internal closed-structure housing 105 is disposed in a housing 101. The internal housing 105 accommodates a circuit board 102 on which a heat generating component 103 is mounted. An air passage for cooling 115 is formed between one lateral surface of the internal housing 105 and an inner wall surface of the housing 101. The housing 101 has, on both sides thereof in the extending direction of the air passage for cooling 115, an air inlet 111 and an air outlet 112. A fan 113 is provided at the air outlet 112.

There is further provided in the housing 101a heat transfer member 104 with one end being in contact with the heat generating component 103 directly or via the internal housing 105 and the other end being located in the air passage for cooling 115. The heat transfer member 104 transfers the heat generated in the heat generating component 103 to the air flowing through the air passage for cooling 115. Thereby, the heat generating component 103 is cooled.

Patent Literature 2 discloses a cooling structure for an electronic device as shown in FIG. 10. In the cooling structure shown in FIG. 10, a pressing member 207 is disposed on an inner wall surface of a housing 201, and the pressing member 207 is covered with a heat diffusing sheet 206. The pressing member 207 presses the heat diffusing sheet 206 against a heat generating component 203 mounted on a circuit board 202. Thereby, the heat generated in the heat generating component 203 escapes to the inner wall surface of the housing 201 via the heat diffusing sheet 206 and the pressing member 207.

Patent Literature 3 discloses an elevator control device 300 as shown in FIG. 11. The elevator control device 300 has a structure for cooling not a small heat generating component mounted on a circuit board but a large heat generating component 303 such as a high power switching element to which a power cable, etc. are connected. That is, in the control device 300, a heat sink 302 having a plurality of fins is disposed on an inner surface of a housing 301 so as to form a flow passage along the inner surface of the housing 301, and the flow passage is connected to a fan 304 with a duct 305. The heat generating component 303 is attached directly to the heat sink 302.

CITATION LIST

Patent Literature

PTL 1: JP 2005-251916 A
PTL 2: JP 10 (1998)-229287 A
PTL 3: WO 01/81224

SUMMARY OF INVENTION

Technical Problem

However, the cooling structure for an electronic device shown in FIG. 9 has a problem of high cost because it requires a heat pipe or the like having high heat conductivity as the heat transfer member 104 in order to transfer the heat from the heat generating component 103 to the air passage for cooling 115. Moreover, when the amount of heat generated in the heat generating component 103 is increased, it is necessary to increase the heat release area of the heat transfer member 104 and the cross-sectional area of the air passage for cooling 115, which further raises the cost.

In the cooling structure for an electronic device shown in FIG. 10, since the heat generating component 203 is in close contact with the inner wall surface of the housing 201 via the heat diffusing sheet 206 and the pressing member 207, the housing 201 may locally have a high surface temperature right under the heat generating component 203 when the amount of heat generated in the heat generating component 203 is increased.

The heat generating component 303 in the elevator control device 300 shown in FIG. 11 is significantly larger than a heat generating component mounted on a circuit board, and thus it is basically impossible to combine the configuration of FIG. 11 with that of FIG. 10. Even if the configuration of FIG. 11 is adopted in the configuration of FIG. 10, the housing 201 still may locally have a high surface temperature right under the heat generating component 203.

The present invention has been accomplished in view of the foregoing circumstance. The present invention is intended to provide a cooling structure for an electronic device capable of, with a relatively low cost configuration, cooling effectively a heat generating component that generates a large amount of heat and suppressing an increase in the surface temperature of a housing.

Solution to Problem

The present invention is a cooling structure for an electronic device incorporating a heat generating component. The cooling structure includes: a circuit board having one surface on which the heat generating component is mounted; a housing accommodating the circuit board; and a heat release member disposed between the one surface of the circuit board and an opposite wall of the housing facing the one surface. The heat release member has a plate that extends in a specified direction and is in contact with the heat generating component, and fins that project from the plate toward the opposite wall and are arranged in the specified direction. In a region of the opposite wall overlapping with the heat release member, an air inlet for taking air into the housing is provided so as to extend in the specified direction. The heat release member is, at both end portions thereof in the specified direction, in contact with the opposite wall via heat-conductive spacers, and a gap is formed between the fins and the opposite wall.

Here, the "heat generating component" refers to an electronic component that generates a relatively large amount of heat (for example, an electronic component that generates 4 W or more of heat). Specific examples thereof include a semiconductor package in which a semiconductor chip is covered with a sealing resin.

Advantageous Effects of Invention

In the above-mentioned configuration, the air inlet and flow passages each formed between the fins of the heat release member open to the gap between the opposite wall of the housing and the fins. Thus, the air drawn through the air inlet flows satisfactorily into the flow passages each formed between the fins, and the heat generated in the heat generating component is transferred effectively to the air flowing between the fins via the plate and the fins. On the other hand, since the heat release member is, at both the end portions thereof, in contact with the opposite wall via the spacers, the heat generated in the heat generating component can escape to the opposite wall via the heat release member and the spacers. Therefore, with the low cost configuration achieved by the heat release member having the fins, the present invention makes it possible to cool effectively the heat generating component even in the case where the heat generating component generates a large amount of heat. Moreover, since the fins are spaced apart from the opposite wall, it is possible to suppress an increase in the surface temperature of the housing at a position corresponding to the heat generating component.

Furthermore, in the above-mentioned configuration, since the spacers each are a separate member from the heat release member, it is possible to control the amount of heat to be transferred to the opposite wall based on the material of the spacers, etc. As a result, it is possible to suppress an increase in the surface temperature of the housing even at a position at which the heat release member is connected to the housing.

DESCRIPTION OF EMBODIMENTS

Hereinafter, embodiments for carrying out the present invention are described with reference to the drawings. The description below describes examples of the present invention and the present invention is not limited by these examples.

(Embodiment 1)

Figure 1:
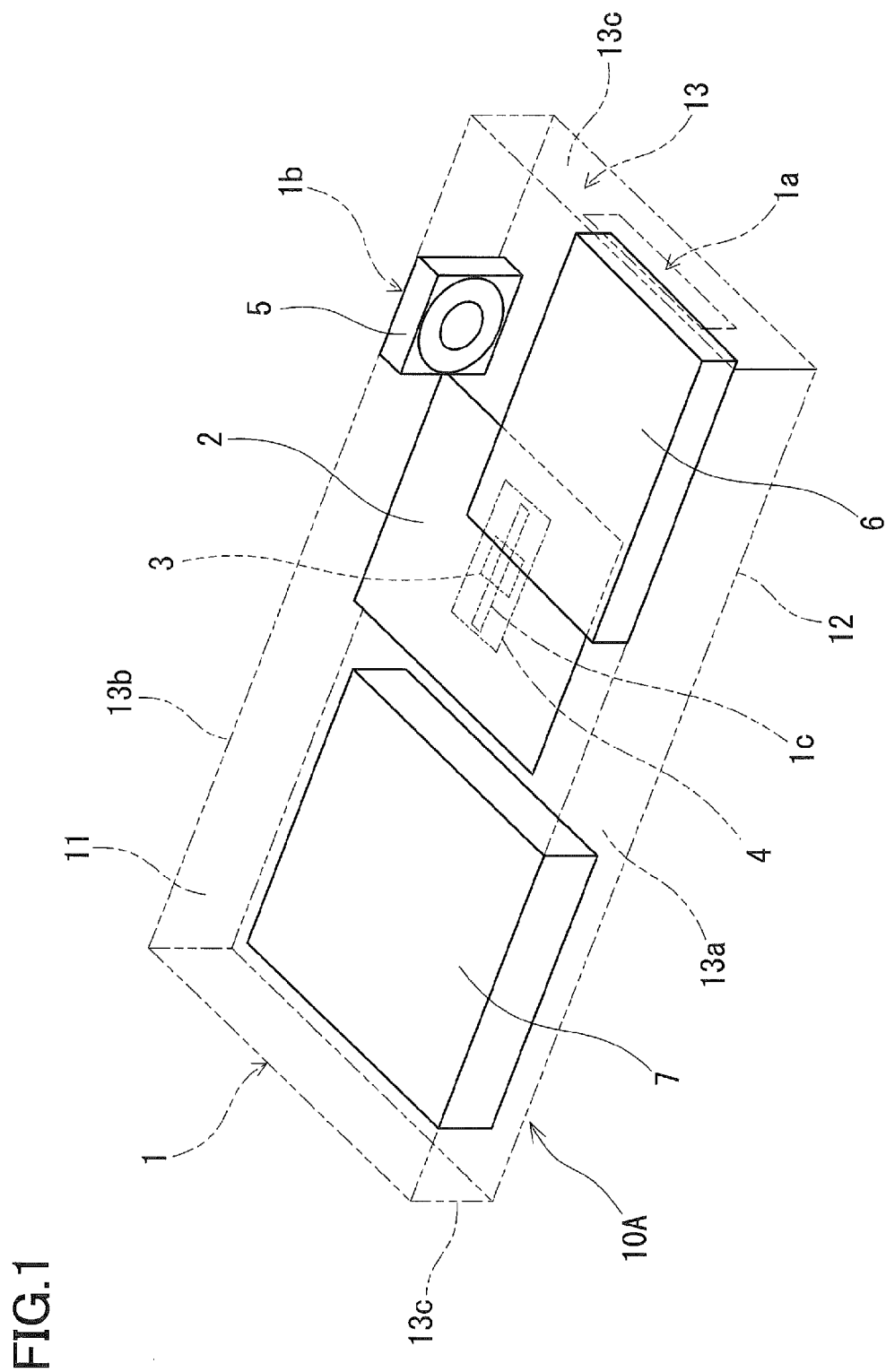
FIG. 1 is a perspective view showing a cooling structure for an electronic device according to Embodiment 1 of the present invention.
Figure 2:
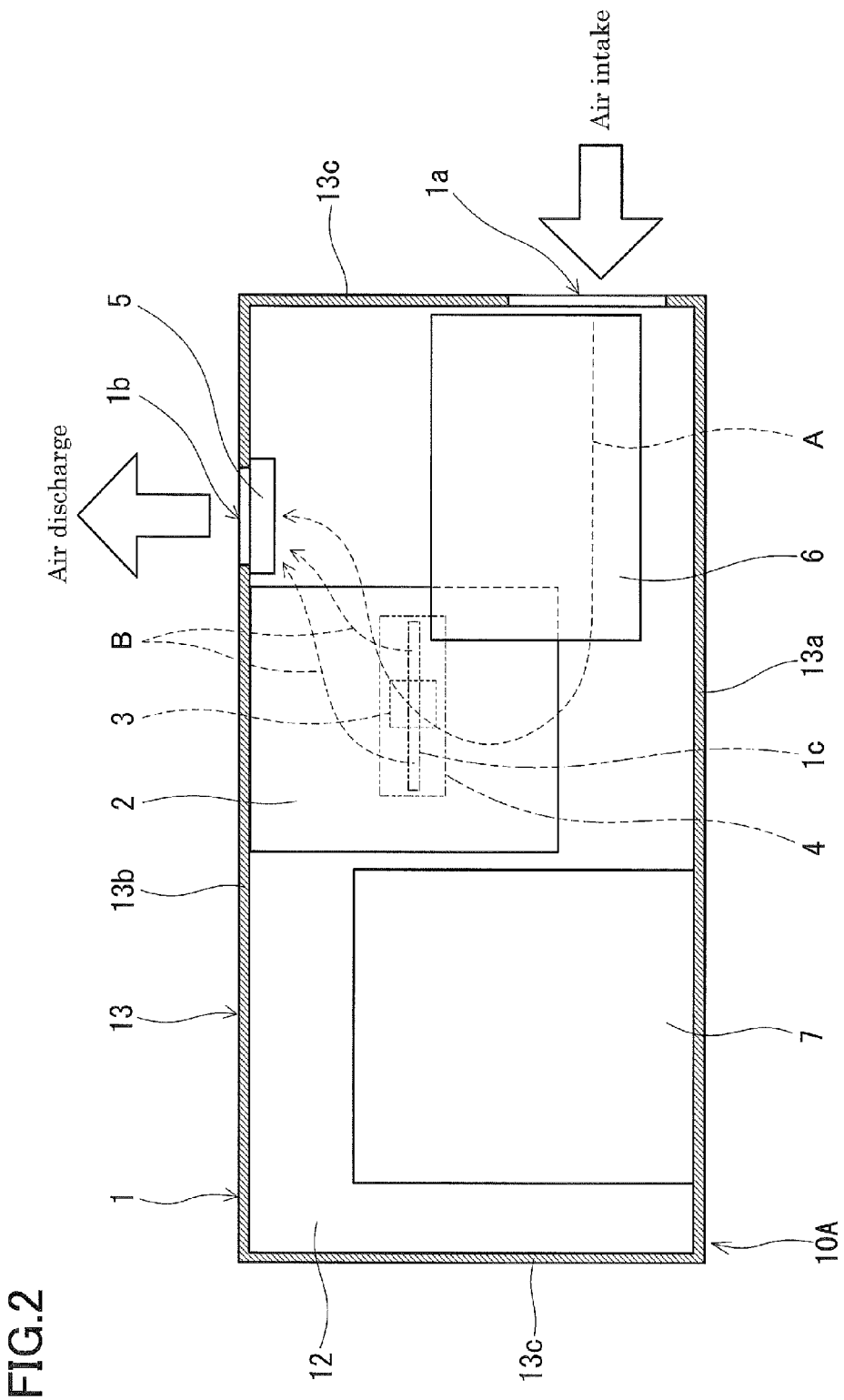
FIG. 2 is a plan view showing the cooling structure for an electronic device according to Embodiment 1 of the present invention.

FIG. 1 and FIG. 2 show a cooling structure 10A for an electronic device according to Embodiment 1 of the present invention. The present embodiment describes an embodiment in which the present invention is applied to a Blu-ray recorder including a storage device 6 and a drive mechanism 7. However, the present invention can be also applied, for example, to other electronic devices such as DVD recorders and CD players.

Specifically, the cooling structure 10A in the present embodiment includes a housing 1 having a box shape flattened in the vertical direction and accommodating the storage device 6 and the drive mechanism 7. The housing 1 has a rectangular cylindrical peripheral wall 13 extending in the vertical direction, and a ceiling wall 11 and a bottom wall 12 closing a space surrounded by the peripheral wall 13 from top and bottom, respectively. In FIG. 1, the housing 1 is illustrated with two-dot chain lines in order to clarify the internal configuration of the electronic device.

The peripheral wall 13 is in a rectangular frame shape in plan view. The peripheral wall 13 has a pair of long side portions 13a and 13b that form a front surface and a back surface of the housing 1, respectively, and a pair of short side portions 13c that form a right lateral surface and a left lateral surface of the housing 1, respectively. The ceiling wall 11 forms an upper surface of the housing 1. The bottom wall 12 forms an undersurface of the housing 1.

The drive mechanism 7 is disposed at a left position in the housing 1. A Blu-ray disc can be inserted into the drive mechanism 7 through the front surface of the housing 1. The storage device 6 is disposed at a right position in the housing 1, spaced apart from the bottom wall 12 (see FIG. 3).

Furthermore, in the housing 1, a circuit board 2 is disposed substantially horizontally between the drive mechanism 7 and the storage device 6 so as to form a specified gap (about 4 to 8 mm, for example) between the circuit board 2 and the bottom wall 12. The circuit board 2 is located below the storage device 6 and overlaps partly with the storage device 6. A heat generating component 3 is mounted on an undersurface of the circuit board 2 facing downward to the bottom wall 12. The bottom wall 12 corresponds to the opposite wall of the present invention.

A fan 5 for ventilating the inside of the housing 1 is attached to the housing 1. In the present embodiment, the housing 1 is provided with two air inlets, a main air inlet 1a and a local air inlet 1c, for taking air into the housing 1, and one air outlet 1b for discharging the air from the inside to the outside of the housing 1. The local air inlet 1c corresponds to the air inlet of the present invention, and the main air inlet 1a corresponds to the second air inlet of the present invention. The main air inlet 1a has a larger opening area than that of the local air inlet 1c.

Specifically, the main air inlet 1a is provided to the short side portion 13c of the peripheral wall 13 forming the right lateral surface of the housing 1, and is located right to the storage device 6. The local air inlet 1c is provided to the bottom wall 12 of the housing 1, and is located under the circuit board 2 (more specifically, under the after-mentioned heat release member 4). In contrast, the air outlet 1b is provided to the long side portion 13b of the peripheral wall 13 forming the back surface of the housing 1, and is located behind the storage device 6. The fan 5 is fixed to an inner surface of the long side portion 13b of the peripheral wall 13 so as to overlap with the air outlet 1b. Although the main air inlet 1a and the air outlet 1b each are actually composed of a plurality of ventilation holes, they each are indicated by one rectangle in the figure for simplification. The structure of the local air inlet 1c will be described later in detail.

Figure 3:
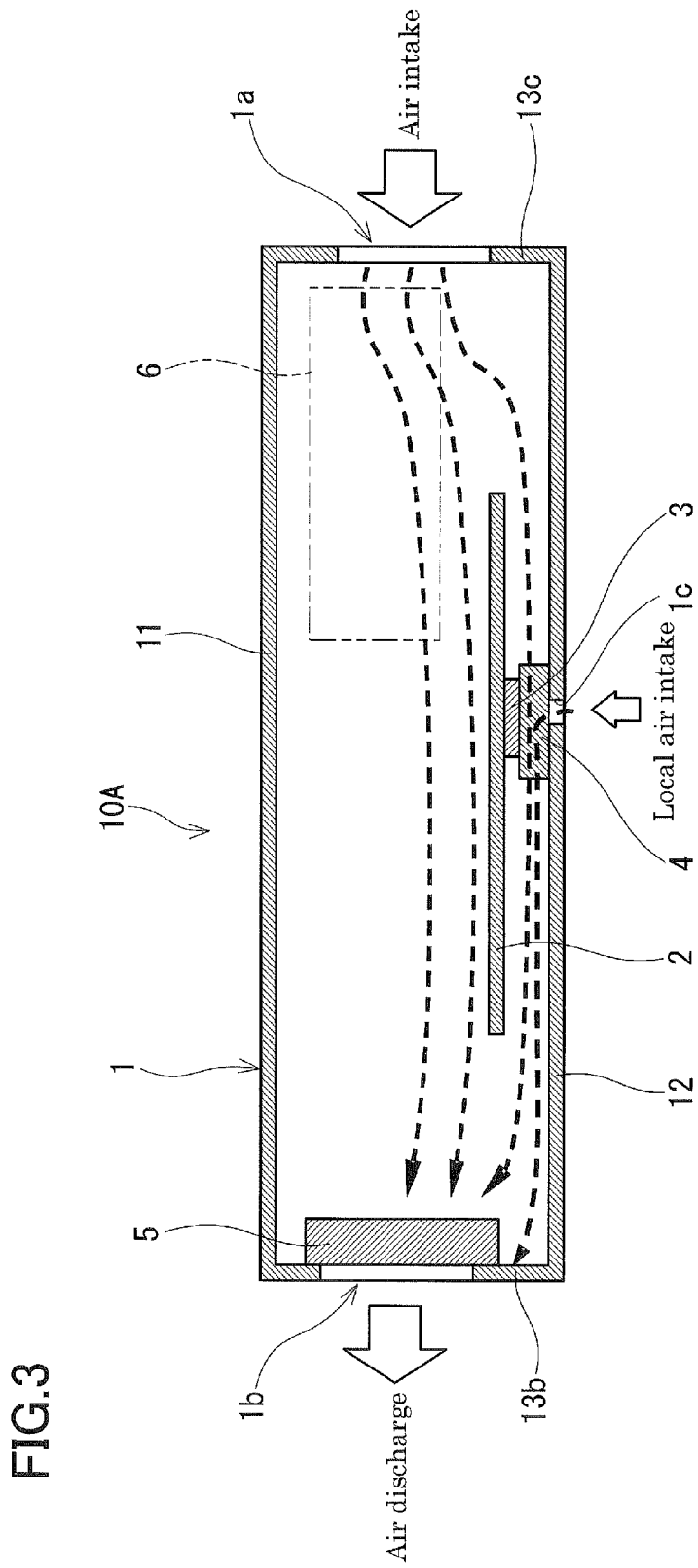
FIG. 3 is a schematic cross-sectional view taken along the arrow A in FIG. 2.

When the fan 5 is operated, a flow of air traveling from the main air inlet 1a to the air outlet 1b is generated as a main airflow for cooling the entire units in the housing 1, as indicated by the arrow A in FIG. 2. As shown in FIG. 3, this main airflow is generated both above and under the circuit board 2. FIG. 3 is a schematic cross-sectional view taken along the arrow A in FIG. 2. Furthermore, the operation of the fan 5 generates not only the main airflow but also a flow of air traveling from the local air inlet 1c to the air outlet 1b as a sub-airflow for cooling particularly the heat generating component 3, as indicated by the arrows B in FIG. 2.

Figure 4:
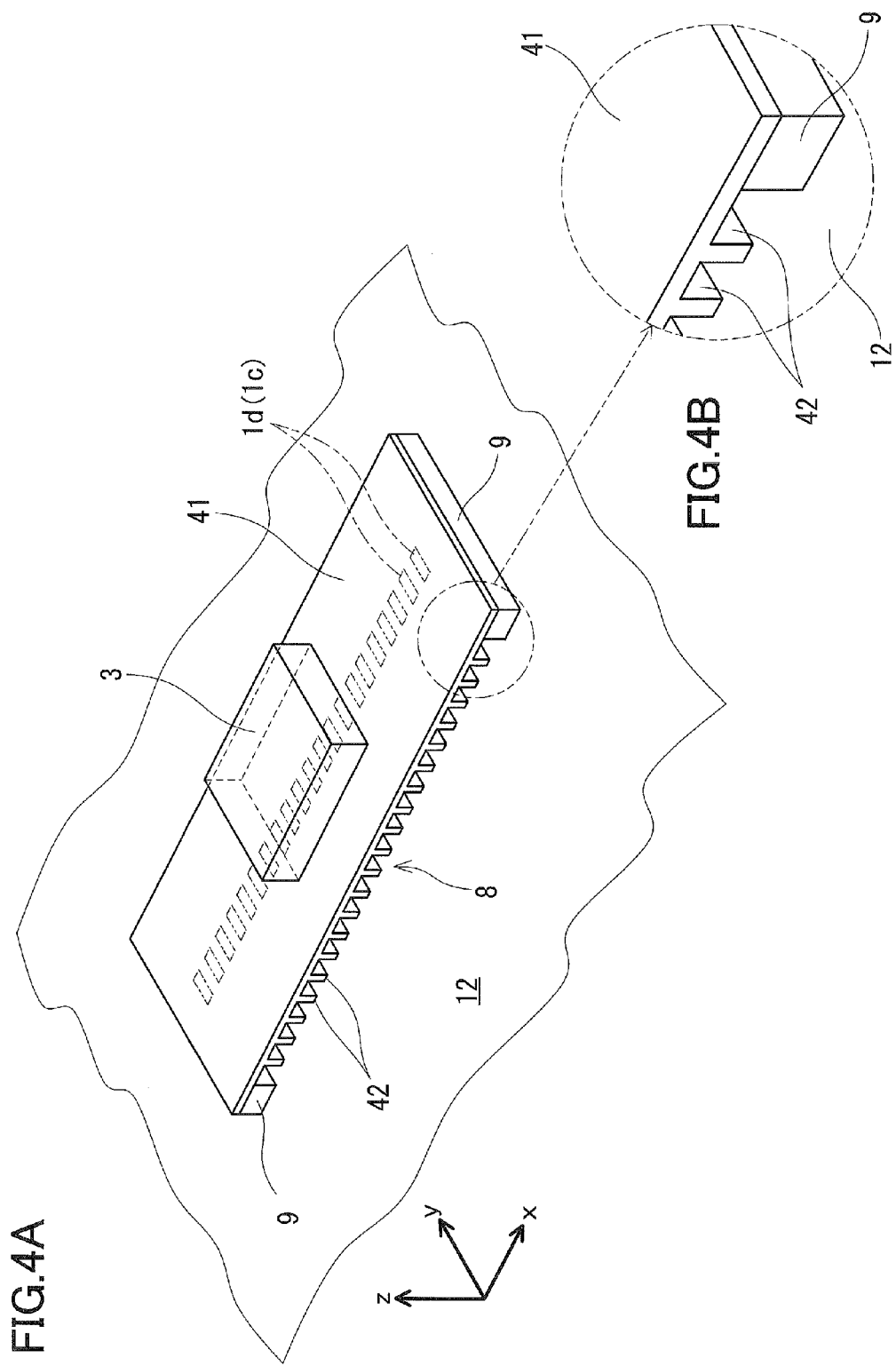
FIG. 4A is a perspective view around a heat release member in the cooling structure for an electronic device according to Embodiment 1 of the present invention.
FIG. 4B is a partially enlarged view of FIG. 4A.
Figure 5:
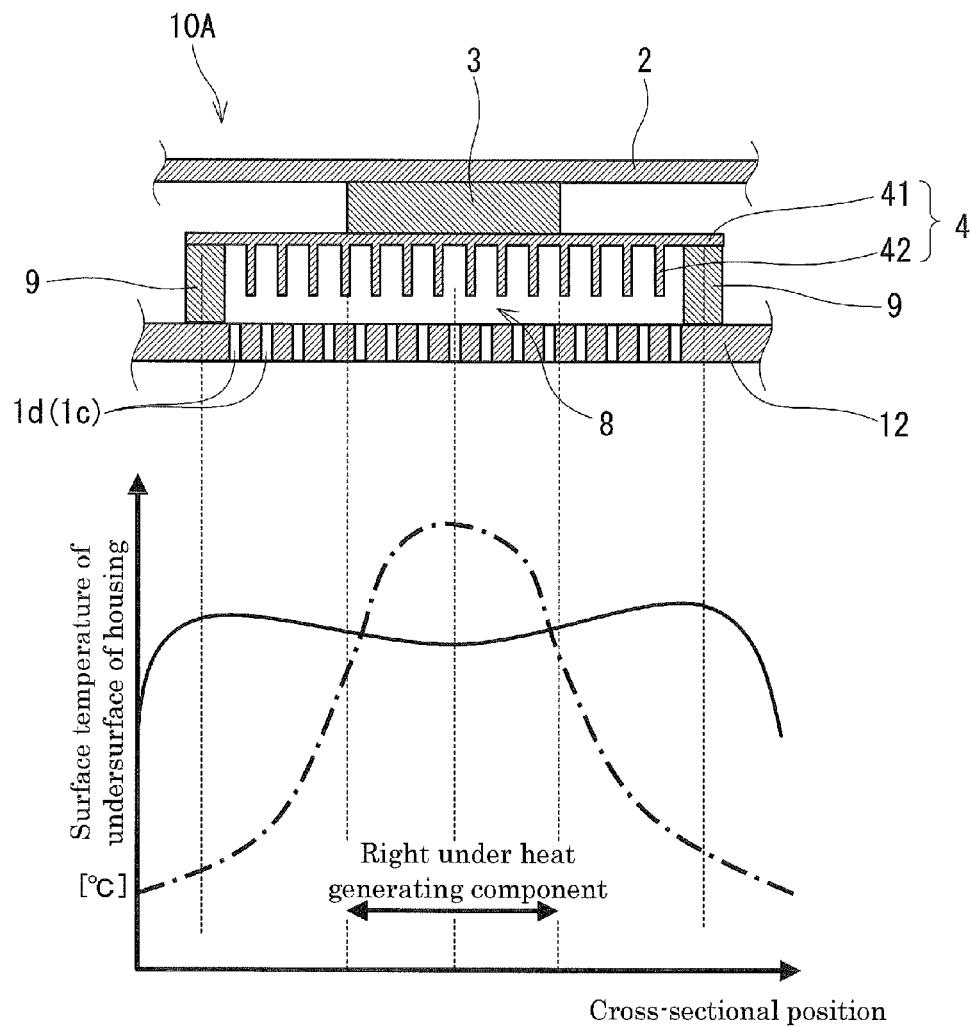
FIG. 5 provides a cross-sectional view of the cooling structure for an electronic device according to Embodiment 1 of the present invention, and a graph showing temperature distributions on an undersurface of a housing.

Moreover, the cooling structure 10A of the present embodiment has a configuration for cooling effectively the heat generating component 3. Specifically, a heat release member 4 is disposed between the undersurface of the circuit board 2 and the bottom wall 12 of the housing 1 so as to be in contact with the heating member 3. The heat release member 4 is rectangular in plan view, and has a configuration that allows air to flow therethrough in the shorter direction perpendicular to the longer direction. As shown in FIGS. 4A and 4B and FIG. 5, heat-conductive spacers 9 are interposed between the bottom wall 12 and both the end portions, in the longer direction, of the heat release member 4. In other words, the heat release member 4 is in contact with the bottom wall 12 at both the end portions in the longer direction via the spacers 9. The heat release member 4 and the spacers 9 are interposed between the bottom wall 12 of the housing 1 and the heat generating component 3 so as to form a heat conductive path through which the heat generated in the heat generating component 3 escapes to the bottom wall 12 and a convection path through which the heat generated in the heat generating component 3 is transferred to the air flowing between the bottom wall 12 and the circuit board 2. Thereby, the heat generating component 3 can be cooled effectively.

The length of the heat release member 4 is set to be sufficiently larger than the width of the heat generating component 3, so that the heat release member 4 protrudes beyond both sides of the heat generating component 3. The orientation of the heat release member 4 relative to that of the heat generating component 3 is not particularly limited as long as the main airflow (the arrow A in FIG. 2) in the housing 1 can pass through flow passages each formed between the after-mentioned fins 42. For example, as shown in FIG. 2, the longer direction of the heat release member 4 may be parallel to the long side portions 13a and 13b of the peripheral wall 13 of the housing 1 and intersect obliquely with the arrow A in FIG. 2. Or the longer direction of the heat release member 4 may be oblique to the long side portions 13a and 13b of the peripheral wall 13 of the housing 1 so as to intersect perpendicularly with the arrow A in FIG. 2.

More specifically, the heat release member 4 has a plate 41 extending in the longer direction of the heat release member 4, and a plurality of fins 42 projecting from the plate 41 toward the bottom wall 12. That is, the longer direction of the heat release member 4 corresponds to the specified direction of the present invention. The shape of the plate 41 is not particularly limited as long as it is long, and it may be elliptical or the like. The specified direction in which the plate 41 extends does not necessarily have to be straight, and it may be curved.

In the present embodiment, the plate 41 is, at the center thereof in the longer direction, in surface contact with the heat generating component 3. Preferably, a grease or the like with high heat conductivity is applied between the heat generating component 3 and the heat transfer plate 41 from the viewpoint of reducing contact heat resistance. However, the plate 41 does not necessarily have to be, at the center thereof in the longer direction, in contact with the heat generating component 3. For example, the plate 41 may be, at one of the end portions in the longer direction, in contact with the heat generating component 3. However, it is preferable that the plate 41 is in contact with the heat generating component 3 at inside an intermediate region of the plate 41 excluding the both end portions (for example, inside a region of 4/5 excluding the both end portions when the overall length of the plate 41 is equally divided into ten, or inside a region of 3/5 excluding the both end portions when the overall length of the plate 41 is equally divided into five).

In the present embodiment, platy straight fins are employed as the fins 42, and the fins 42 are arranged in the longer direction of the heat release member 4 so that the fins 42 are parallel to each other. However, the fins of the present invention are not limited by this, and they may be a plurality of columnar pin fins from the viewpoint of enhancing heat releasing property. In this case, the pin fins are disposed in a matrix or in a staggered manner, and the pin fins are arranged not only in the longer direction of the heat release member 4 but also in another direction.

The fins 42 can be molded, by an extruding process, as an integral part made of the same material as that of the plate 41. However, the fins 42 and the plate 41 may be formed by a cutting process, a drawing process or the like.

The fins 42 each have a thickness of about 1.2 mm, for example. As the material composing the fins 42, aluminum can be used suitably. However, any material can be used as long as it is a metal material with high heat conductivity. Moreover, in order to accelerate the heat transfer by radiation, it is preferable to apply a black alumite treatment or a coating for increasing the radiation rate to surfaces of the fins 42.

The spacers 9 each serve a role of preventing the heat release member 4 from being in direct contact with the bottom wall 12. In the present embodiment, the spacers 9 are sandwiched between the bottom wall 12 and both the end portions, in the longer direction, of the plate 41. That is, in the present embodiment, a gap 8 is formed between the fins 41 and the bottom wall 12 by the presence of the spacers 9.

The spacers 9 are not particularly limited as long as they have heat conductivity. However, it is preferable that the spacers 9 each are an elastic flexible sheet from the viewpoint of reducing the contact heat resistance on the contact surface, adjusting dimensional tolerance in the height direction between the bottom wall 12 and the circuit board 2, and absorbing the impact to the heat generating component 3 at the time of handling. The spacers 9 may be joined to the heat release member 3 and the bottom wall 12 with a double-sided tape having high heat conductivity, or may be fixed to the bottom wall 12 with screws.

The above-mentioned local air inlet 1c is provided in a region of the bottom wall 12 overlapping with the heat release member 4 so as to extend in the longer direction of the heat release member 4. In the present embodiment, from the viewpoint of the ease of processing, the local air inlet 1c is defined by a plurality of slits 1d arranged in the longer direction of heat release member 4 and extending in the shorter direction of the heat release member 4 (see FIG. 4A). However, the local air inlet 1c may be one long narrow slit present continuously in the longer direction of the heat release member 4. Alternatively, the local air inlet 1c may be defined by, for example, a plurality of circular or rectangular ventilation holes disposed in a matrix or in a staggered manner so as to form a band extending in the longer direction of the heat release member 4.

Preferably, the local air inlet 1c has a length (dimension in the x direction in FIG. 4A) that is approximately equal to a distance by which the spacers 9 are spaced apart from each other. Here, the phrase "approximately equal" indicates that the length of the local air inlet 1c is 0.9 times or more but 1.1 times or less of the distance by which the spacers 9 are spaced apart from each other. Such a length makes it possible to guide approximately uniformly the air from the local air inlet 1c to all of the flow passages each formed between the fins 42. The width (dimension in the y direction in FIG. 4B) of the local air inlet 1d is determined suitably in accordance with the strength necessary for the housing 1, etc.

It is preferable that when, out of both ends of each flow passage formed between the fins 42, one end from which a larger amount of air flows out is referred to as a first end, and the other end from which a smaller amount of air flows out is referred to as a second end, the region, in the shorter direction of the heat release member 4, in which the local air inlet 1c is present is a region extending from a position distanced inwardly from the first end by a distance of 0.3 times of the width of the heat release member 4 to the second end. In the present embodiment, as indicated by the arrows B in FIG. 2, an airflow traveling a shortest route from the local air inlet 1c to the air outlet 1b is generated. Thus, out of the both ends of each flow passage formed between the fins 42, the one closer to the air outlet 1b is the first end, and the air does not flow out from the second end that is opposite to the first end. However, in such a case where there is an obstacle on the shortest route from the air inlet 1c to the air outlet 1b and the airflow from the air inlet 1c collides with the plate 41 of the heat release member 4 and is divided to both sides, the end closer to the air outlet 1b can be the second end.

In the cooling structure 10A described above, the local air inlet 1c and the flow passages each formed between the fins 42 open to the gap 8 between the bottom wall 12 of the housing 1 and the fins 42 of the heat release member 4. Thus, the air drawn through the local air inlet 1c flows satisfactorily into the flow passages each formed between the fins 42, and the heat generated in the heat generating component 3 is transferred effectively to the air flowing between the fins 42 via the plate 41 and the fins 42. On the other hand, since the heat release member 4 is, at both the end portions thereof, in contact with the bottom wall 12 via the spacers 9, the heat generated in the heat generating component 3 can escape to the bottom wall 12 via the heat release member 4 and the spacers 9. Therefore, with the low cost configuration achieved by the heat release member 4 having the fins 42, the present embodiment makes it possible to cool effectively the heat generating component 3 even in the case where the heat generating component 3 generates a large amount of heat. Moreover, since the fins 42 are spaced apart from the bottom wall 12, it is possible to suppress an increase in the surface temperature of the housing 1 right under the heat generating component 3.

Furthermore, in the configuration of the present embodiment, since the spacers 9 each are a separate member from the heat release member 4, it is possible to control the amount of heat to be transferred to the bottom wall 12 based on the material of the spacers 9, etc. In other words, it is possible to change the heat resistance of the spacers 9 based on the thickness, area, heat conductivity, etc. of the spacers 9, thereby making it possible to control optionally the amount of heat to be transferred to the bottom wall 12. As a result, it is possible to suppress an increase in the surface temperature of the housing 1 even at a position at which the heat release member 4 is connected to the housing 1.

Moreover, since the housing 1 is provided with the main air inlet 1a having a larger opening area than that of the local air inlet 1c, the heat generated from heat sources (such as a power circuit) in the housing 1 other than the heat generating component 3 can be transferred effectively to the air drawn through the main air inlet 1a, and the entire electronic device can be cooled effectively. Furthermore, since not only the air drawn through the local air inlet 1c but also the air drawn through the main air inlet 1a can flow into the flow passages each formed between the fins 42, the convection between the fins 42 becomes more effective.

Moreover, since the heat release member 4 protrudes, in the arrangement direction of the fins 42, beyond both sides of the heat generating component 3, the heat release member 4 can lead the heat generated in the heat generating component 3 to the bottom wall 12 while diffusing the heat broadly. Therefore, the heat release by convection and the heat release by the radiation from the undersurface of the housing 1 can be performed further effectively.

In addition, in the present embodiment, since straight fins are employed as the fins 42, the fins 42 can be molded integrally with the plate 41. Thereby, the work for joining the fins 42 to the plate 41 is unnecessary, and thermal and material reliabilities on the joining interface therebetween can be enhanced because they can be handled as an integral part.

Figure 6:
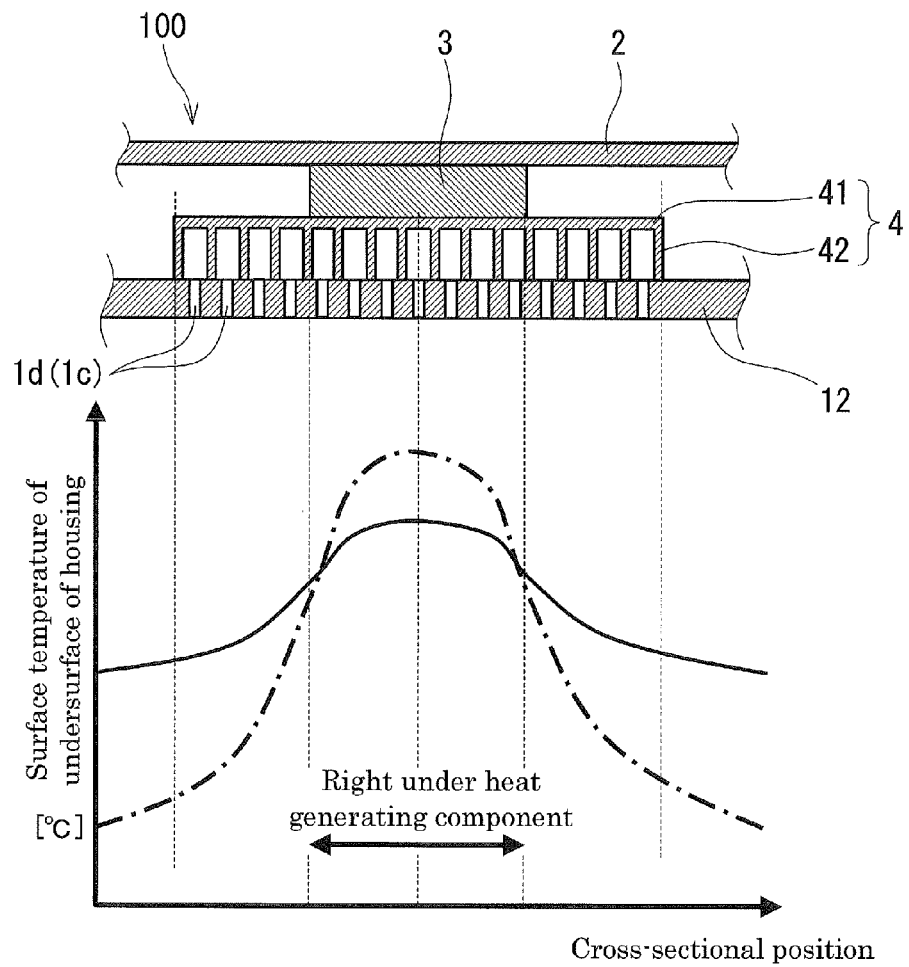
FIG. 6 provides a cross-sectional view of a cooling structure for an electronic device in a comparative example, and a graph showing temperature distributions on an undersurface of a housing.

Here, the effects of the present embodiment are described in detail with reference to the graph in FIG. 5. Before that, with reference to FIG. 6, a description is made with regard to a cooling structure 100 for an electronic device as a comparative example in which the spacers 9 are not provided and all of the fins 42 are in contact with the bottom wall 12.

Assume that the amount of heat generated in the heat generating component 3 is 15 W. In the case where the heat generating component 3 is in close contact with the bottom wall 12 via, for example, a heat conductive rubber, the surface temperature of the undersurface of the housing 1 locally exceeds 70° C. right under the heat generating component 3, as indicated by the dashed dotted line in FIG. 5 and FIG. 6. In the case where all of the fins 42 are in contact with the bottom wall 12 as in the case of the cooling structure 100 of the comparative example, the peak of the surface temperature of the undersurface of the housing 1 is equal to or lower than a specified temperature (70° C., for example) but it is still high as indicated by the solid line in FIG. 6.

In contrast, in the cooling structure 10A of the present embodiment, since all of the fins 42 are spaced apart from the bottom wall 12, the heat generated in the heat generating component 3 is released from the fins 42 only by air convection. On the other hand, from both the end portions of the plate 41 to the bottom wall 12, the heat adjusted through the heat resistance of the spacers 9 is transferred so as not to cause a local temperature increase. As a result, the peak of the surface temperature of the undersurface of the housing 1 can be lowered further as shown in FIG. 5. Thereby, it is possible to achieve effective cooling while allowing the undersurface of the housing 1 to have a surface temperature equal to or lower than a specified value.

(Embodiment 2)

Figure 7:
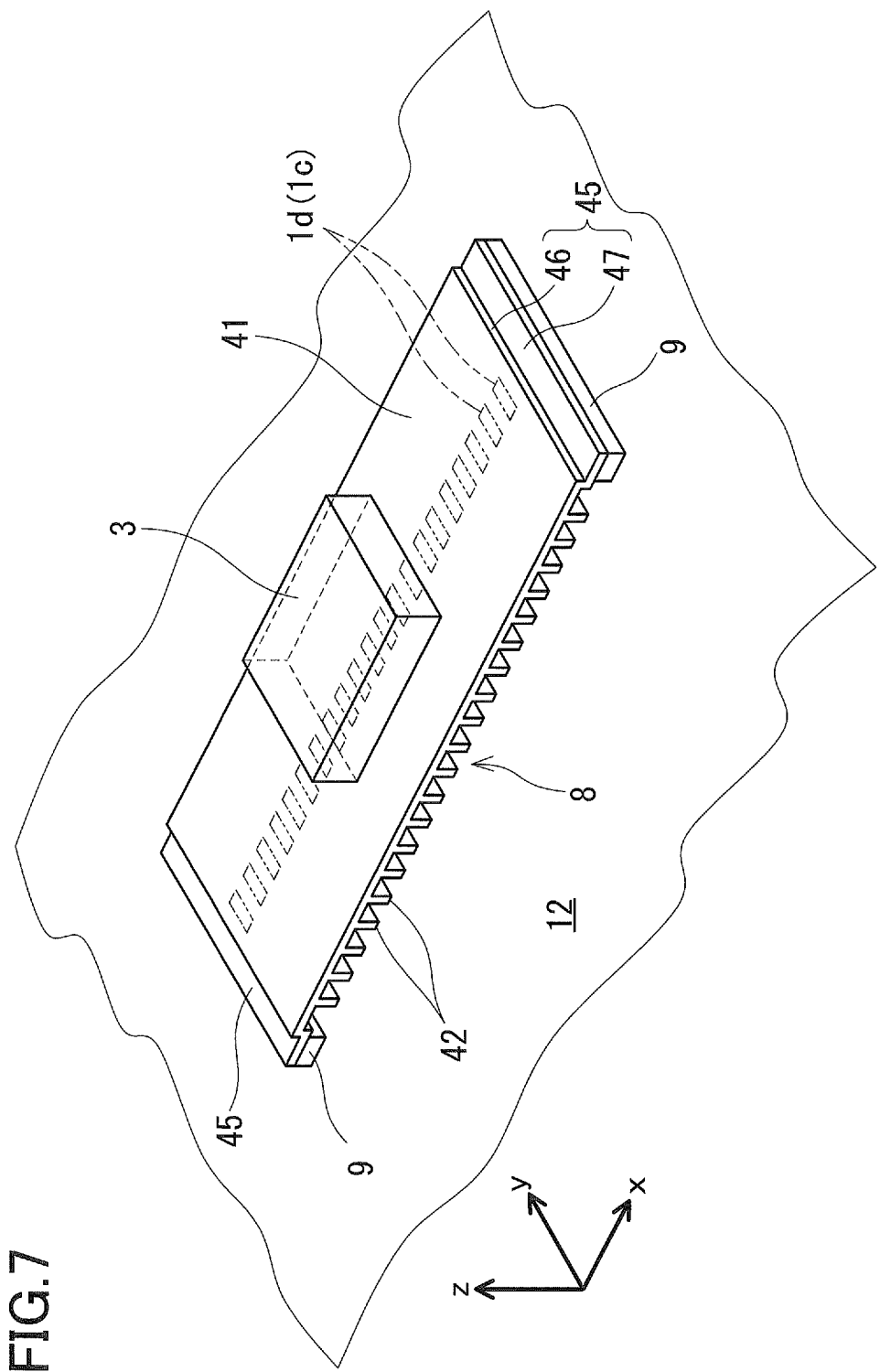
FIG. 7 is a perspective view around a heat release member in a cooling structure for an electronic device according to Embodiment 2 of the present invention.
Figure 8:
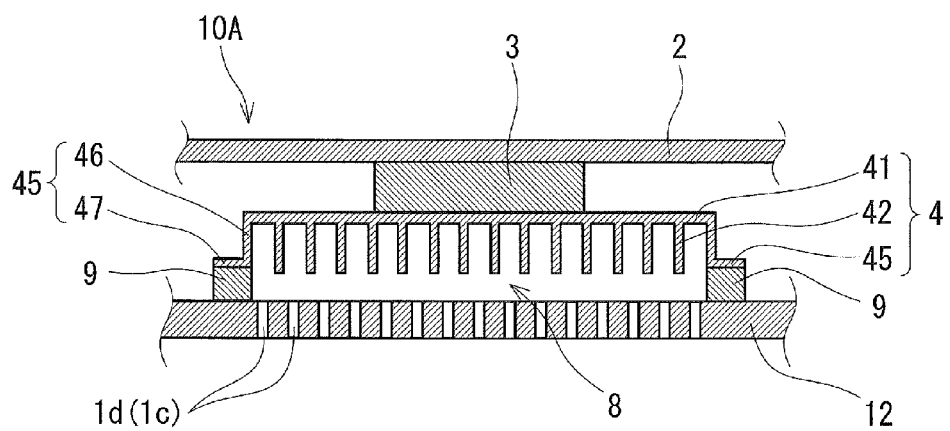
FIG. 8 is a cross-sectional view of the cooling structure for an electronic device according to Embodiment 2 of the present invention.
Figure 9:
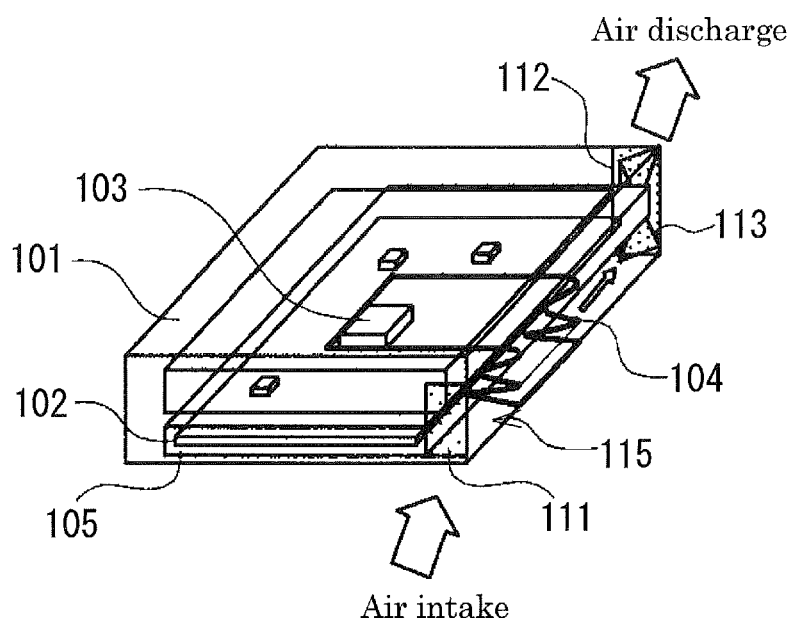
FIG. 9 is a perspective view showing a conventional cooling structure for an electronic device.
Figure 10:
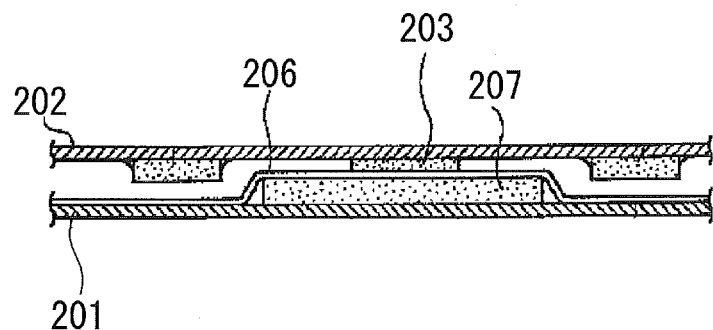
FIG. 10 is a cross-sectional view of another conventional cooling structure for an electronic device.
Figure 11:
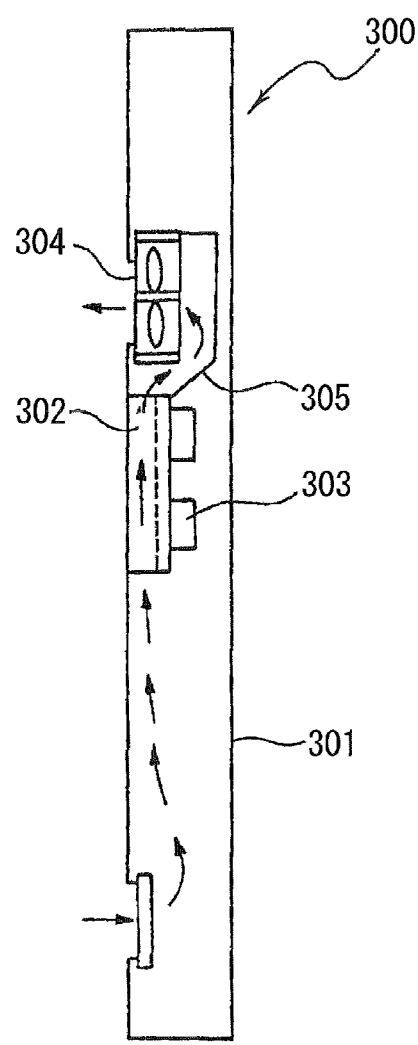
FIG. 11 is a cross-sectional view of a conventional elevator control device.

Next, a cooling structure for an electronic device according to Embodiment 2 of the present invention is described with reference to FIG. 7 and FIG. 8. Embodiment 2 is different from Embodiment 1 only in the shape of the heat release member 4 and the thickness of the spacers 9. The rest of the configuration is the same as that in Embodiment 1 and the description thereof is omitted.

In Embodiment 1, it is possible to adjust the height of the gap 8 formed between the fins 42 and the bottom wall 12 based on the thickness of the spacers 9 disposed at both the end portions of the heat release member 4. In contrast, in the present embodiment, protrusions 45 are provided respectively to both the end portions, in the longer direction, of the plate 41, and it is possible to adjust the height of the gap 8 formed between the fins 42 and the bottom wall 12 based on the shape of the protrusions 45.

The protrusions 45 protrude from the plate 41 so as to be closer to the bottom wall 12. The spacers 9 are sandwiched between the protrusions 45 and the bottom wall 12. Specifically, the protrusions 45 each have a L-shaped cross section, and include a supporting portion 46 extending perpendicularly from the plate 41, and an extended portion 47 that extends, in a direction opposite to the fins 42, from an edge of the supporting portion 46 and that is parallel to the plate 41. The protrusions 45 can be molded integrally with the fins 42 and the plate 41 by an extruding process. That is, the heat release member 4 having the protrusions 45 can be produced at relatively low cost.

The supporting portions 46 each may have a length smaller than the height of the fins 42. Also in this case, the gap 8 is formed between the fins 42 and the bottom wall 12 by the presence of the spacers 9 as in Embodiment 1. Conversely, the supporting portions 46 each may have a length larger than the height of the fins 42. In this case, the gap 8 is formed between the fins 42 and the bottom wall 12 by the presence of the protrusions 45 and the spacers 9.

When the protrusions 45 are provided respectively at both the end portions of the plate 41 of the heat release member 4 as in the present embodiment, it is possible to form the gap 8 between the fins 42 and the bottom wall 12 while reducing the thickness of the spacers 9 interposed between the bottom wall 12 and both the end portions of the heat release member 4, thereby obtaining the same effects as in Embodiment 1.

As the thickness of each spacer 9, a minimum necessary thickness of about 1 mm is ensured from the viewpoint of absorbing the impact. The heat conductivity of the spacers 9 is controlled so that the spacers 9 serve as heat resistors and the amount of heat to be transferred to the bottom wall 12 is set to a desired value.

The shapes and dimensions of the protrusions 45 and the spacers 9 may be determined suitably in accordance with the amount of heat generated in the heat generating component 3 so that the temperature of the heat generating component 3 and the temperature of the undersurface of the housing 1 are equal to or lower than desired temperatures.

(Other Embodiments)

In each of the above-mentioned embodiments, the heat release member 4 is disposed between the bottom wall 12 of the housing 1 and the undersurface of the circuit board 2. However, in the case where the circuit board 2 is disposed near the ceiling wall 11 of the housing 1, the heat generating component 3 may be mounted on an upper surface of the circuit board 2, and the heat release member 4 may be disposed between the upper surface of the circuit board 2 and the ceiling wall 11 of the housing 1. In this case, the ceiling wall 11 corresponds to the opposite wall of the present invention.

It should be noted that the upper surface of the housing 1 desirably has a low temperature taking a case into consideration such that a user touches it with his/her hand. Thus, it is more preferable, as in each of the embodiments, that the heat release member 4 is disposed between the bottom wall 12 of the housing 1 and the undersurface of the circuit board 2 so as to release heat to the bottom wall 12 of the housing 1. Furthermore, since the bottom wall 12 generally has a higher rigidity than that of the ceiling wall 11 in order to support the components, the configuration as in each of the embodiments is preferable in that the heat diffusion in a plane direction is performed satisfactory in the housing 1.

INDUSTRIAL APPLICABILITY

The present invention is useful particularly for a cooling structure for an electronic device in which a heat generating component, such as an LSI and a CPU, is included in a housing.

The invention claimed is:

1. A cooling structure for an electronic device incorporating a heat generating component, the cooling structure comprising:
   a circuit board having one surface on which the heat generating component is mounted;
   a housing accommodating the circuit board; and
   a heat release member disposed between the one surface of the circuit board and an opposite wall of the housing facing the one surface, the heat release member having a plate that extends in a specified direction and is in contact with the heat generating component, and fins that project from the plate toward the opposite wall and are arranged in the specified direction,
   wherein in a region of the opposite wall overlapping with the heat release member, an air inlet for taking air into the housing is provided so as to extend in the specified direction, and
   the heat release member is, at both end portions thereof in the specified direction, in contact with the opposite wall via heat-conductive spacers, and a gap is formed between the fins and the opposite wall.

2. The cooling structure for an electronic device according to claim 1, wherein the spacers each are an elastic sheet.

3. The cooling structure for an electronic device according to claim 1, wherein the spacers are sandwiched between the opposite wall and both end portions, in a longer direction, of the plate.

4. The cooling structure for an electronic device according to claim 1, wherein protrusions that protrude from the plate so as to be closer to the opposite wall are provided respectively to both the end portions, in the longer direction, of the plate, and the spacers are sandwiched between the protrusions and the opposite wall.

5. The cooling structure for an electronic device according to claim 4, wherein the protrusions each include a supporting portion extending perpendicularly from the plate, and an extended portion extending, in a direction opposite to the fins, from an edge of the supporting portion.

6. The cooling structure for an electronic device according to claim 1, wherein the air inlet is provided so as to have a length that is approximately equal to a distance by which the spacers are spaced apart from each other.

7. The cooling structure for an electronic device according to claim 1,
   wherein the housing has a peripheral wall extending in a vertical direction, and a ceiling wall and a bottom wall closing a space surrounded by the peripheral wall from top and bottom, respectively, and
   the one surface of the circuit board is an undersurface facing downward, and the opposite wall is the bottom wall.

8. The cooling structure for an electronic device according to claim 7, wherein the peripheral wall is provided with a second air inlet having a larger opening area than that of the air inlet.

* * * * *